United States Patent
Chen et al.

[11] Patent Number: 6,144,557
[45] Date of Patent: Nov. 7, 2000

[54] SELF-LOCKING CONDUCTIVE PIN FOR PRINTED WIRING SUBSTRATE ELECTRONICS CASE

[75] Inventors: Shiaw-Jong S. Chen, Plano; Roger J. Hooey, Rockwall, both of Tex.

[73] Assignee: Lucent Technologies, Inc., Murray Hill, N.J.

[21] Appl. No.: 09/289,686

[22] Filed: Apr. 9, 1999

[51] Int. Cl.[7] .................................................... H05K 7/20
[52] U.S. Cl. .................... 361/704; 174/52.2; 361/818; 363/141
[58] Field of Search .................. 174/52.2, 51; 165/80.3, 165/185; 363/141; 257/712, 717, 787, 796; 361/704, 705, 707, 712, 717–719, 736, 752, 816, 784, 818

[56] References Cited

U.S. PATENT DOCUMENTS

| | | |
|---|---|---|
| 4,325,103 | 4/1982 | Ito . |
| 4,502,098 | 2/1985 | Brown . |
| 4,599,680 | 7/1986 | Gibson . |
| 5,835,350 | 11/1998 | Stevens .................................. 361/704 |
| 5,901,040 | 5/1999 | Cromwell . |
| 5,905,622 | 5/1999 | Finlay, Sr. . |
| 5,907,478 | 5/1999 | Watanabe . |
| 6,031,732 | 2/2000 | Koike . |

*Primary Examiner*—Gerald Tolin

[57] ABSTRACT

An electronics case, a method of manufacturing the same and a power module incorporating the case. In one embodiment, the case includes: (1) an enclosure including a metal substrate and a dielectric material located on inner surfaces of the enclosure that insulate the substrate from electronics components located within the enclosure, the enclosure having an aperture on a major surface thereof and (2) an electrically conductive pin, passing through the aperture and an interior of the enclosure to emerge from the enclosure at a point opposite the major surface, the pin functioning both as a heat sink mount for the case and a case ground pin for the substrate.

12 Claims, 3 Drawing Sheets

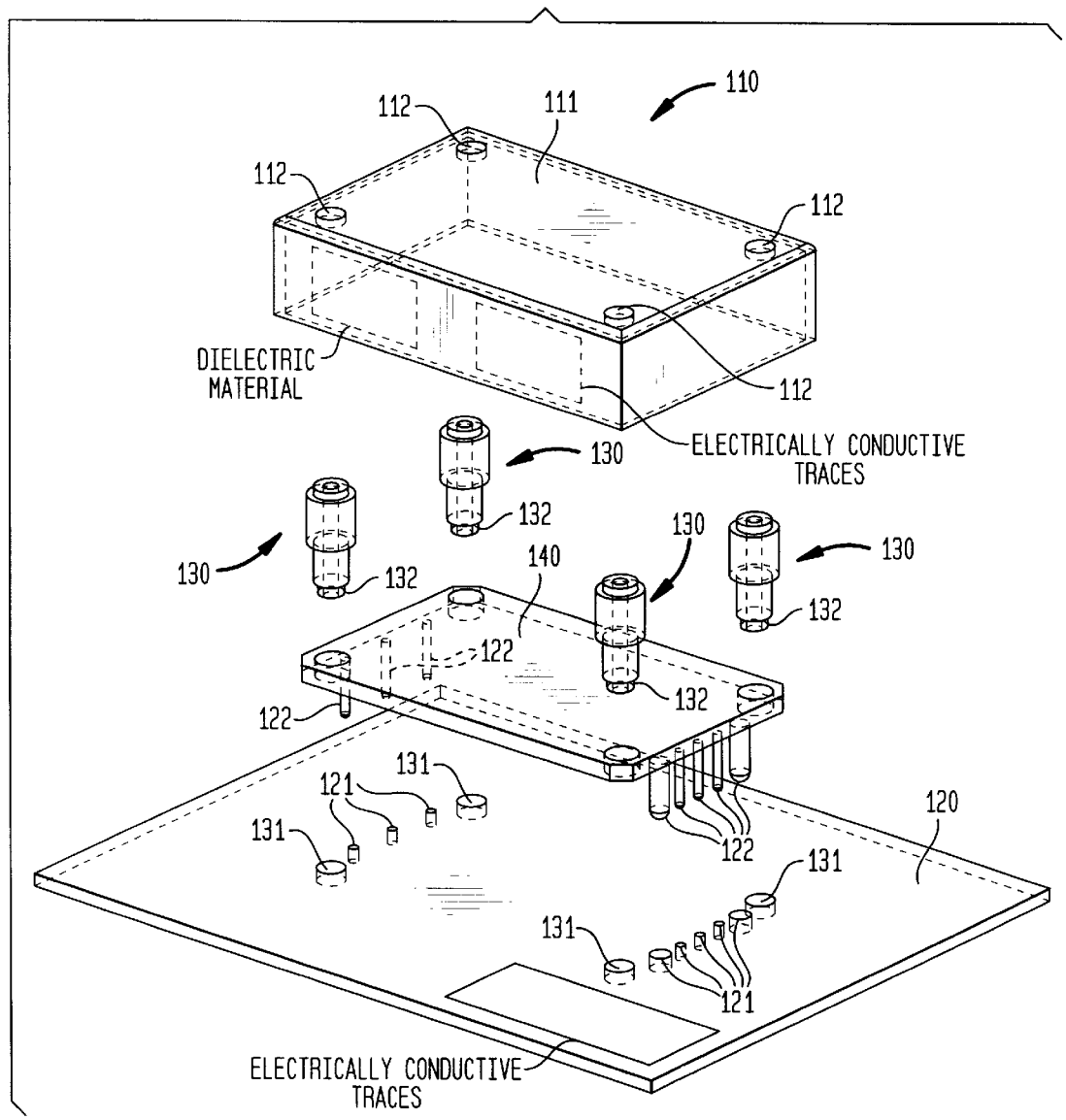

SELF-LOCKING CONDUCTIVE PIN FOR PRINTED WIRING SUBSTRATE ELECTRONICS CASE

TECHNICAL FIELD OF THE INVENTION

The present invention is directed, in general, to an electronics chassis and, more specifically, to a self-locking, electrically conductive pin for printed wiring substrate electronics case and method of manufacture therefor.

BACKGROUND OF THE INVENTION

Electronic devices for power supplies and similar applications are conventionally provided in a protective, heat-dissipating package. Often, the device (e.g., a metal oxide semiconductor field-effect transistor, or "MOSFET") is attached to a lead-frame by a wire bonding technique. The device is then encapsulated or "potted," wherein an encapsulant is formed about the device to yield a unitary, board-mountable package device. One well-known configuration for board-mountable package is a so-called dual in-line package("DIP"), wherein electrical leads protrude from opposing sidewalls of the package. The leads are advantageously arranged to allow the package to be mounted to a circuit board by various conventional soldering processes. DIPs are widely used for packaging integrated circuits, most often in telecommunications or computer-related environments.

As with other types of electronic components, the trend in the design of power supplies has been toward achieving increased power and device density and lower device profile. As power suppliers become smaller, less space is available to provide the necessary electrical functions in order for the device to operate. This means surplus pins, that were normally available to handle case grounding functions, are no longer present on some circuits. The device density on boards also prohibits the addition of other case grounding devices, such as leads fastened to screws or studs.

A significant improvement in types of board mountable electronic devices was made in the encapsulated board mountable power supply of the type described in Stevens, U.S. Pat. No. 5,835,350, entitled "Encapsulated, Board-Mountable Power Supply and Method of Manufacture Therefor." Such a device represents a significant manufacturing advance and convenience from both a time and monetary perspective. While the invention described in Stevens provided a significant advance in the manufacture of electronic equipment, it continues to share the limitation of other new generation, smaller-sized, board mountable electronic circuits, which is the lack of a convenient method to ground the substrate of the device housed in the case with the supporting substrate upon which the device is mounted.

Accordingly, what is needed in the art is a device or method to provide a case grounding connection between a substrate of a circuit contained in a board mountable case and the substrate that supports the cased circuit as a part or component of a larger circuit. However, any improvements in power, density and profile cannot be at the expense of the electrical characteristics of the components and the overall power supply. Such a case grounding device or method may advantageously also preserve the convenience of an assembly process that permits a self-contained cased circuit to be plugged into a supporting substrate. Preferably, the technique should be cost-effective and suitable for mass production.

SUMMARY OF THE INVENTION

To address the above-discussed deficiencies of the prior art, the present invention provides an electronics case, a method of manufacturing the same and a power module incorporating the case. In one embodiment, the case includes: (1) an enclosure including a metal substrate and a dielectric material located on inner surfaces of the enclosure that insulates the substrate from electronics components located within the enclosure, the enclosure having an aperture on a major surface thereof and (2) an electrically conductive pin, passing through the aperture and an interior of the enclosure to emerge from the enclosure at a point opposite the major surface, the pin functioning both as a heat sink mount for the case and a case ground pin for the substrate.

The present invention therefore introduces the broad concept of providing a pin (most advantageously a case ground pin) that is inserted through an electronics case and locks to a printed circuit board. The pin not only serves as a mount for a heat sink, but also as a case ground pin for the substrate. In one embodiment of the present invention, multiple pins are provided to yield multiple mounts for a heat sink and multiple case ground pins for the substrate.

In one embodiment of the present invention, the pin has a collar that locks the pin to a printed circuit board with conductive traces located thereon. The pin is preferably inserted into place when other heat sink mounting pins are coupled to the case.

In one embodiment of the present invention, the components are components of a power converter. In the embodiment to be illustrated and described, the power converter components and case cooperate to form a power module, which may itself be board-mounted as a single unit. Thus, in one embodiment of the present invention, the structure is a printed circuit board having electrically conductive traces located thereon. In another embodiment, the enclosure forms a reservoir to receive a circuit board therein.

In one embodiment of the present invention, the case further includes an encapsulant at least partially occupying the enclosure.

The encapsulant, while not necessary to the present invention, nonetheless provides support for electronic components within the enclosure and rigidity to the case as a whole.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 1 illustrates an exploded isometric view of an electronics case, supporting substrate and electrically conductive pins;

DETAILED DESCRIPTION

Figure 2A:
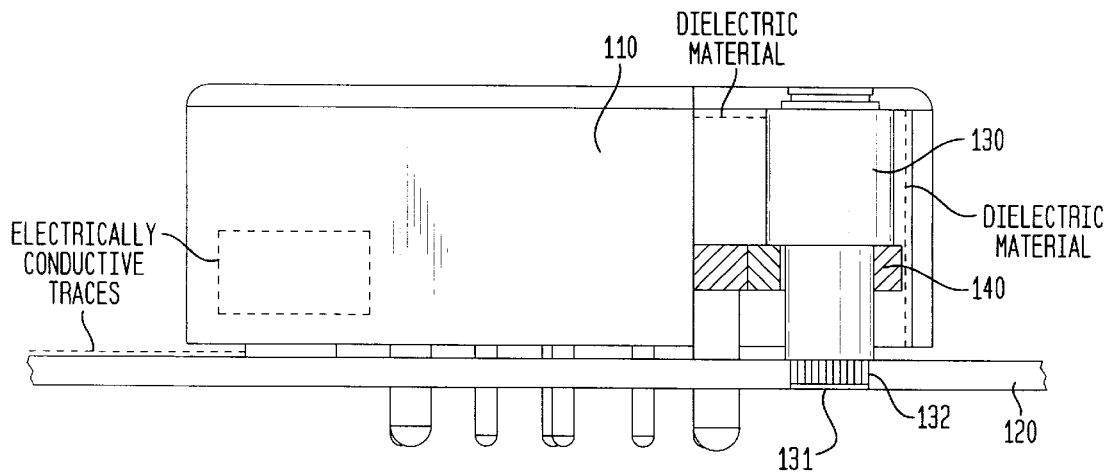
FIG. 2A illustrates an elevational side view of an electronics case mounted on a supporting substrate with a cutout view of the electrically conductive pin secured to the supporting substrate by a force-fit collar with a knurled end.

Referring initially to FIG. 1, illustrated is an exploded isometric view of an electronics case 110, supporting substrate 120 and electrically conductive pins 130. The electronics case 110 is an enclosure containing various electronic components that make up an electronic circuit and is formed from a metal substrate. When initially formed, the case 110 usually only has a top 111 and one to four sidewalls and may not have a bottom surface. In one embodiment, described herein, the bottom surface of the case 110 may be an encapsulant that surrounds the components in the case 110.

The inner surface of the metal substrate making up the sides and top 111 of the case 110 is lined with a dielectric material (not shown) that insulates the metal substrate from electronic components located within the case 110. The metal substrate and dielectric material lining can also serve as a printed wiring or circuit board for the electronic components contained therein by locating electrically conductive traces thereon. In another embodiment, the case 110 enclosure is a reservoir that receives a separate circuit board 140 therein that may include some or all of the electronic components of a circuit. The circuit board 140 can be placed inside the case 110 by either compression fitting it therein or using other methods familiar to those skilled in the art.

Extending from the bottom of the case 110 are electrical pins 122 to provide electrical connectivity between the circuit and components within the case 110 and the electronic circuit associated with the supporting substrate 120 upon which the case 110 is mounted. In FIG. 1, the electrical pins 122 extend from the bottom of a circuit board 140 that is mounted within the case 110. On the surface of the supporting substrate 120 are apertures 121 to receive the electrical pins 122 and complete the electrical connection.

A mountable case 110, of the type illustrated, permits a manufacturer to use off-the-shelf preassembled cased circuits to assemble and manufacture electronic systems. In one embodiment of the invention, for example, the electronic components and circuitry contained within the case 110 cooperate to yield a modular power converter (or "board-mountable power supply"). A mountable case 110 of this type provides an advantageous method for manufacturers to use electronic circuits of wide application that can be largely standardized, such as converters and other power circuits, in the assembly of larger electronic systems.

In one embodiment of the invention, the circuit and components contained in the case 110 are held in place by an encapsulant, such as epoxy or some other dielectric polymers. The encapsulant occupies at least part of the case 110 enclosure and may actually be the surface that is in direct contact with a supporting substrate 120 when the case 110 is mounted. The encapsulant, while not necessary in some embodiments of the present invention, provides support for electronic components within the case 110 and rigidity to the case 110 as a whole. A power supply and method of manufacture of a mountable case 110 of this type is described in Stevens, et. al., U.S. Pat. No. 5,835,350, entitled "Encapsulated, Board-Mountable Power Supply and Method of Manufacture Therefor," which is incorporated herein by this reference thereto.

Turning again to FIG. 1, on the top 111 major surface of the case 110 are four apertures 112. Inserted through each aperture 112 is an electrically conductive pin 130, one end of which has a collar 132 that locks into an electrically conductive pin aperture 131 on the supporting substrate 120 circuit board that, in most cases, has electrically conductive traces located thereon. The electrically conductive pin 130 passes through the aperture 112 and interior of the case 110, to emerge from the enclosure formed by the case 110 at a point opposite the top surface 111. The pin 130 functions both as a heat sink mount for the case 110 and as a case ground pin for the substrate that forms the case 110 sidewalls and top 111. The pins 130 illustrated in FIG. 1 have a hollow shank to receive fasteners for mounting a heat sink over the case 110. The heat sink can be fastened to the pins 130 by using self-threading fasteners, or the hollow shanks of the pins 130 can be prethreaded to receive screws, bolts or mounting posts extending from the heat sink.

Figure 2B:
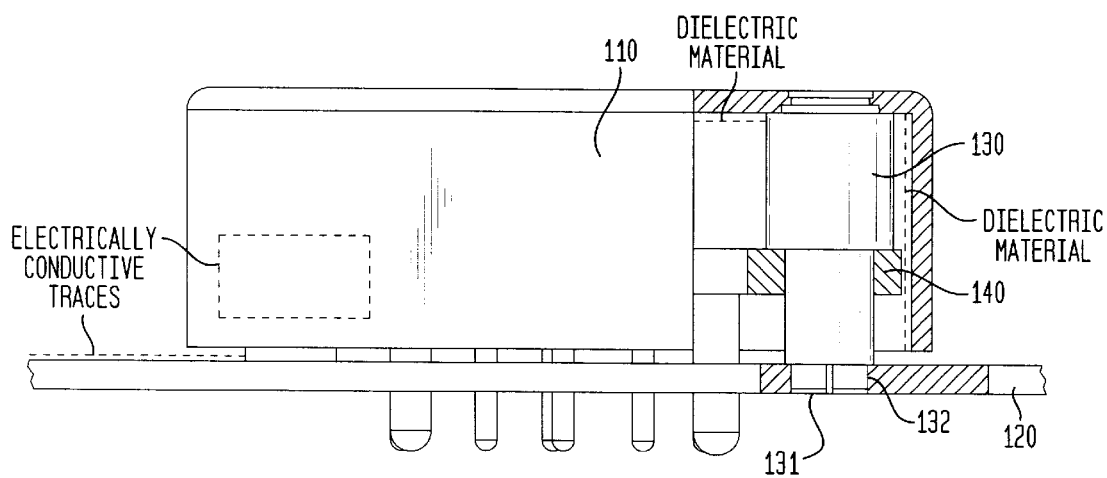
FIG. 2B illustrates an elevational side view of an electronics case mounted on a supporting substrate with a cutout view of the electrically conductive pin secured to the supporting substrate by a collar that has a snap-in feature at the end of the pin.

Turning now to FIG. 2A, illustrated is an elevational side view of an electronics case 110 mounted on a supporting substrate 120. The partial cutout on the side of the case 110 illustrates the electrically conductive pin 130 passing through the enclosure formed by the case 110. In the illustrated embodiment, the pin 130 also passes through a printed circuit board 140 mounted inside the case 110. The end of the pin 130 emerging from the case 110 enclosure is inserted into an electrically conductive pin aperture 131 on the supporting substrate 120. In certain embodiments, the ground connection to improve electromagnetic interference control. The collar 132 on the illustrated pin 130 is knurled so that it can be force-fit into the supporting substrate 120 and lock itself into place. Those skilled in the art will understand that other pin 130 terminations are also within the scope of the present invention. For example, FIG. 2B illustrates a collar 132 that has a snap-in feature to lock the pin 130 to the supporting substrate 120 and make the case ground connection. In another embodiment, solder covers one end of the pin 130.

Figure 3:
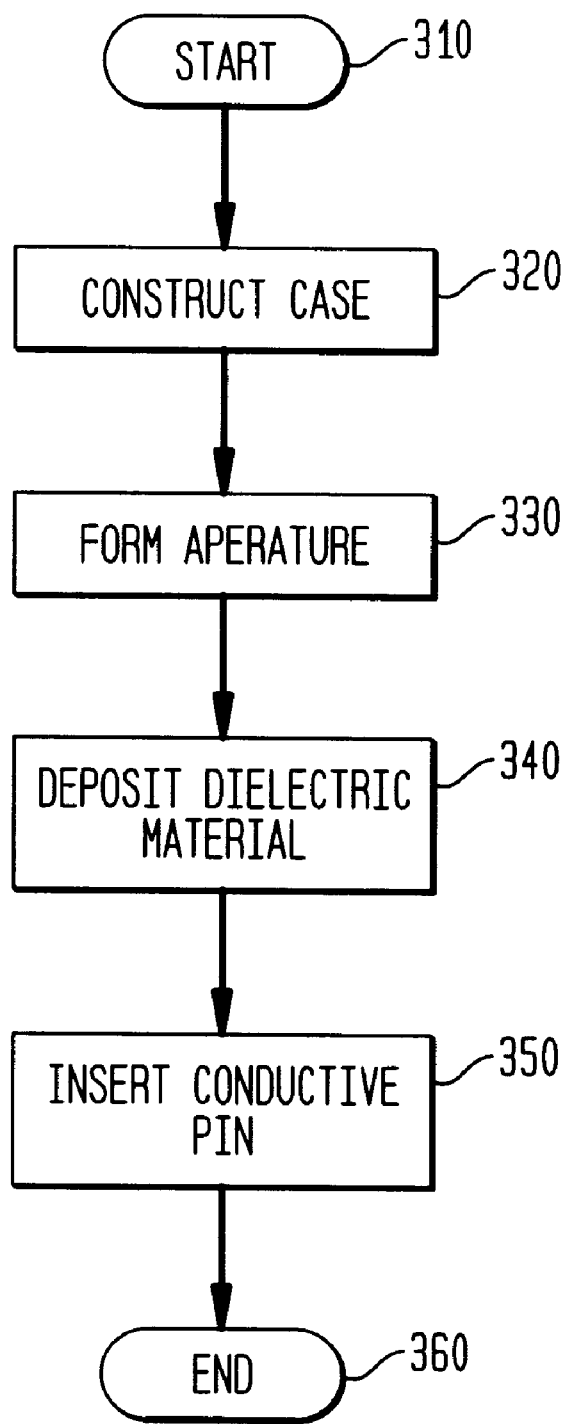
FIG. 3 is a flow diagram of a method of manufacturing an embodiment of an electronics case constructed in accordance with the principles of the present invention.

Turning now to FIG. 3, illustrated is a flow diagram of one embodiment of a method of manufacturing an electronics case according to the principles of the present invention. The method begins at a start step 310. The next step is folding a metal substrate to form the sidewalls and top of an enclosure having a reservoir therein during a construct case step 320. The peripheral sidewalls may be sealed through several methods such as, without limitation, applying an adhesive, applying an interference-fit plastic insert, welding the corners of the sidewalls, or soldering the interior corners to provide a solderable pattern on an interior layer of the case. Regardless of the selected method, if an encapsulant is to placed in the case, the corners should be meticulously sealed to prevent escape of the encapsulant while placing the encapsulant within the case or during curing of the encapsulant.

The next step is to form an aperture on a major surface of the case in a form aperture step 330. The aperture is formed to receive an electrically conductive pin passing through the aperture the interior enclosure of the case to emerge from the enclosure opposite the major surface.

A dielectric material is then deposited on the inner surfaces of the case sidewalls during a deposit dielectric material step 340. The dielectric material provides insulation for electronic components located within the case. Of course, it is well within the scope of the invention if dielectric material is deposited on the substrate before the construct case step 320. In one embodiment of manufacturing the electronics case, a plurality of electrically conductive traces are located on the dielectric material, which electrically conductive traces are insulated from the metal substrate. The electrically conductive traces are placed on the dielectric material at such time, or times, as those skilled in the art determine.

An electrically conductive pin is then inserted through the aperture and the interior of the case to emerge from the case opposite the aperture in an insert conductive pin step 350. Of course, any number of apertures can be provided during the form aperture step 330 and any number of electrically conductive pins can be inserted during the insert conductive pin step 350 and still be within the scope of the invention.

Other manufacturing embodiment steps within the scope of the present invention include a step to install the electronic components of a power converter (not shown) and at least partially filling the enclosure with an encapsulant (not shown), which steps occur at such time as those skilled in the art may determine. If an encapsulant is used to partially fill the enclosure, environmental protection (e.g., protection from dirt and moisture) for the electronic components located within the case is provided. The manufacturing method concludes at a end step 360.

The completed case, which may be a power converter, can then be coupled to a printed wiring or circuit supporting substrate using any number of techniques including, without limitation, through hole attachment, surface mounting, connector attachment or mechanical piece part attachment (e.g., compression mounting). In one embodiment, the end of The electrically conductive pin is covered with solder.

An electronics case is constructed according to the principles of the present invention as described with respect to the preceding FIGURES. The aforementioned electronics case and method of manufacturing are submitted for illustrative purposes only. Other case embodiments and alternative methods of manufacturing in accordance with the general principles, as submitted herein, are well within the broad scope of the present invention.

The foregoing has outlined, rather broadly, preferred and alternative features of the present invention so that those skilled in the art may better understand the invention. Although the present invention has been described in detail, those skilled in the art should understand that they can make various changes, substitutions and alterations herein without departing from the spirit and scope of the invention in its broadest form.

What is claimed is:

1. An electronics case, comprising:

an enclosure made of a metal substrate and a dielectric material located on inner surfaces of said enclosure that insulates said substrate from electronics components located within said enclosure, said enclosure having an aperture on a major surface thereof; and an electrically conductive pin, passing through said aperture and into the interior of said and enclosure and emerging from said enclosure at a point opposite said major surface, said pin functioning both as a heat sink mount for said case and a case ground pin for said substrate.

2. The case as recited in claim 1 wherein said pin has a collar that locks said pin to a printed circuit board having electrically conductive traces located thereon.

3. The case as recited in claim 1 further comprising a plurality of electrically conductive traces located on said dielectric material and insulated from said substrate.

4. The case as recited in claim 1 wherein solder covers one end of said pin.

5. The case as recited in claim 1 wherein said components are components of a power converter.

6. The case as recited in claim 1 wherein said case is coupled to a printed circuit board having electrically conductive traces located thereon.

7. A power module, comprising:

an enclosure made of a metal substrate and a dielectric material located on inner surfaces of said enclosure, said enclosure having an aperture on a major surface thereof;

an electrically conductive pin, passing through said aperture and into the interior of said enclosure and emerging from said enclosure at a point opposite said major surface, said pin functioning both as a heat sink mount for said module and a module ground pin for said substrate; and power converter components coupled to said dielectric material, said material insulating said substrate from said power converter components.

8. The power module as recited in claim 7 further comprising a plurality of electrically conductive traces located on said dielectric material and insulated from said substrate.

9. The power module as recited in claim 8 wherein said pin has a collar that locks to a printed circuit board having electrically conductive traces located thereon.

10. The power module as recited in claim 9 wherein solder covers one end of said pin.

11. The power module as recited in claim 9 further comprising an encapsulant at least partially occupying said enclosure.

12. The power module as recited in claim 9 wherein said power module is coupled to a printed circuit board having electrically conductive traces located thereon.

* * * * *